United States Patent [19]

Kokubo

[11] Patent Number: 5,920,229
[45] Date of Patent: Jul. 6, 1999

[54] POWER AMPLIFIER APPARATUS

[75] Inventor: Kenichi Kokubo, Ota, Japan

[73] Assignee: Sanyo Electric Co., Ltd., Osaka, Japan

[21] Appl. No.: 08/961,745

[22] Filed: Oct. 31, 1997

[30] Foreign Application Priority Data

Oct. 31, 1996 [JP] Japan .................. 8-290691

[51] Int. Cl.⁶ .............. H03F 1/14; H03F 3/68; H04R 5/00
[52] U.S. Cl. .................. 330/51; 330/124 R; 381/28
[58] Field of Search ................. 330/51, 124 R, 330/124 D, 146, 297; 381/28, 120, 121

[56] References Cited

U.S. PATENT DOCUMENTS

| | | | |
|---|---|---|---|
| 4,339,730 | 7/1982 | Yokoyama . | |
| 4,721,919 | 1/1988 | Larosa et al. . | |
| 5,365,188 | 11/1994 | Botti et al. ......................... | 330/51 |
| 5,708,390 | 1/1998 | Dunnebacke .................... | 330/51 |

FOREIGN PATENT DOCUMENTS

| | | | |
|---|---|---|---|
| 0309063 | 3/1989 | European Pat. Off. .......... | H03F 1/32 |
| 0618673 | 10/1994 | European Pat. Off. .......... | H03F 1/02 |
| 6338738 | 12/1994 | Japan .............................. | H03F 3/30 |

OTHER PUBLICATIONS

Kilian, E.A., "Ein neues Verstarkerkonzept fur Autoradios", *Funkschau* 65(1996) Apr. 16, No. 9, Munchen, DE pp. 76–79.

*Primary Examiner*—Robert Pascal
*Assistant Examiner*—Patricia Nguyen
*Attorney, Agent, or Firm*—Loeb & Loeb LLP

[57] ABSTRACT

In a power amplifier apparatus, a positive output signal of left front output amplifier (2LF), a negative output signal of left rear output amplifier (3LR), a negative output signal of right front output amplifier (3RF), and a positive output signal of right rear output amplifier (4RR) are applied to an adder (9), which selects the signal showing the highest level out of the four signals and generates a voltage corresponding to the selected signal. Switching power source (10) is adapted to operate according to the output signal of the adder (9) and produces a power source voltage to each of the high efficiency amplifiers. The positive output signal of the left front output amplifier and that of the right rear output amplifier are identical and substantially in-phase, whereas the negative output signal of the left rear output amplifier and that of the right front output amplifier are identical and substantially in-phase. Thus, a power source voltage is generated for each of the high efficiency amplifiers while providing fewer adders than the number of loads.

10 Claims, 4 Drawing Sheets

POWER AMPLIFIER APPARATUS

BACKGROUND OF THE INVENTION

1. Field of the Invention

This invention relates to a power amplifier apparatus for used with a 4-channel stereophonic system loaded in a motor vehicle and so on.

2. Description of the Related Art

Known power amplifiers include that disclosed in Japanese Patent Laid-Open Publication No. Hei (JP-A) 6-338738. That power amplifier is adapted for high efficiency operation by selecting a DC output voltage that is very close to the ground potential and driving the load by means of a BTL (balanced transformerless) drive technique, using half-wave signals. FIG. 1 of the accompanying drawings shows a circuit diagram of the known power amplifier.

Referring to FIG. 1, input signal IN is applied to the negative input terminal of a first differential amplifier 1, which produces corresponding opposite phase output signals from its positive and negative output terminals. The positive and negative output signals of the first differential amplifier 1 are amplified by first and second output amplifiers 2 and 3. Said first and second output amplifiers 2 and 3 constitute a BTL amplifier and the load 4 (e.g., a speaker) of the power amplifier is BTL-driven by output signals X and Y of the first and second output amplifiers 2 and 3.

The output signals X and Y of the first and second output amplifiers 1 and 2 are non-linearly added to each other by means of a non-linear adder 5. The non-linear adder 5 is activated to operate as an adder when the output signals of the first and second output amplifiers 2 and 3 are below a predetermined level, and operate as a clamp circuit when the output signals exceed the predetermined level. The output signal of the non-linear adder 5 is applied to the negative input terminal of a second differential amplifier 6, which produces an output signal as a function of the output signal of the non-linear adder 5 and the reference voltage Vref of its positive input terminal. The output signal is then applied to common terminal C of the first differential amplifier 1. The common terminal C is used to determine the output DC voltage of the first and second output amplifiers 2 and 3, in which output DC voltage is controlled as a function of the output signals a and b of the first and second output amplifiers 2 and 3. Therefore, the output DC voltage of the first and second output amplifiers 2 and 3 is selected to be close to the ground potential level and the output signals X and Y of the first and second output amplifiers 2 and 3 are half-wave output signals.

On the other hand, the output signals of the first and second output amplifiers 2 and 3 are added to each other by means of an adder 7, which selects the signal with the higher level from the output signals of the first and second output amplifiers 2 and 3. Switching power source 8 is driven for switching operation according to the output signal z of the adder 7 in order to produce power source voltage Vs for the first and second output amplifiers 2 and 3.

There is also known a 4-channel stereophonic system loaded in a motor vehicle and comprising first and second power amplifiers for amplifying left stereophonic signals and third and fourth power amplifiers for amplifying right stereophonic signals, wherein said first and third power amplifiers are paired to drive the front speakers in the cabin of a motor vehicle while said second and fourth power amplifiers are paired to drive the rear speakers in the cabin of the motor vehicle.

When power amplifies having a circuit configuration as shown in FIG. 1 are used for such a car stereophonic system, a total of four power amplifiers must be installed. If four power amplifiers with the circuit configuration of FIG. 1 are simply combined, a total of four adders 7 must then be used, which makes the entire system bulky and clumsy. Particularly, if the four power amplifiers are integrally arranged on a single substrate, the chip will have a large surface area mainly due to the existence of the adders.

SUMMARY OF THE INVENTION

In view of the above identified problem of known power amplifiers, it is therefore the object of the present invention to provide a power amplifier apparatus with a reduced number of adders and BTL-drive a plurality of loads.

According to the invention, the above object is achieved by providing a power amplifier apparatus comprising: first and second high efficiency amplifiers for amplifying a first input signal and BTL-driving first and second loads by means of their respective output signals; third and fourth high efficiency amplifiers for amplifying a second input signal and BTL-driving third and fourth loads by means of their respective output signals. Said first and third high efficiency amplifiers forming a pair, while said second and fourth high efficiency amplifiers form another pair. A selection circuit is included for selecting the signal with the highest level from the output signals of said first and fourth high efficiency amplifiers showing substantially equal phases and predetermined respective levels and the output signals of said second and third high efficiency amplifiers showing substantially equal respective phases and predetermined respective levels, while a switching power source adapted for switching operation as a function of the output signal of said selection circuit generates a power source voltage for said first through fourth high efficiency amplifiers.

Each of said first through fourth high efficiency amplifiers comprises: first and second output amplifiers for generating respectively first and second output signals to BTL-drive the corresponding ones of said loads; a non-linear adder for non-linearly adding the output signals of said first and second output amplifiers; and a non-linear amplifier for amplifying the input signal and generating an output signal to be applied to said first and second output amplifiers as its output DC voltage is controlled by the output signal of said non-linear adder.

According to another aspect of the invention, there is also provided a power amplifier apparatus comprising: first and second high efficiency amplifiers for amplifying a first input signal and BTL-driving first and second loads by means of their respective output signals; third and fourth high efficiency amplifiers for amplifying a second input signal and BTL-driving third and fourth loads by means of their respective output signals; said first and third high efficiency amplifiers forming a pair, while said second and fourth high efficiency amplifiers forming another pair. In this aspect, one of the two output signals of said first high efficiency amplifier and the non-corresponding one of the two output signals of said second high efficiency amplifier are the same, with only their phases being opposite relative to each other; one of the two output signals of said third high efficiency amplifier and the non-corresponding one of the two output signals of said fourth high efficiency amplifier are the same, with only their phases being opposite relative to each other; one of the output signals of said first high efficiency amplifier and said non-corresponding one of the output signals of said fourth high efficiency amplifier are substantially in-phase; said non-corresponding one of the output signals of said second high efficiency amplifier and said one of the output signals of said third high efficiency amplifier are substantially in-phase; a selection circuit for selecting the signal with the highest level from among the output signals of said first and fourth high efficiency amplifiers showing substantially equal respective phases and predetermined respective levels and the output signals of said second and third high efficiency amplifiers showing substantially equal respective phases and predetermined respective levels; and a switching power source adapted for switching operation as a function of the output signal of said selection circuit and generating a power source voltage for said first through fourth high efficiency amplifiers.

According to the invention, one of the output signals of the first high efficiency amplifier and one non-corresponding output signal of the second high efficiency amplifier are the same, but with opposite phase., while one non-corresponding output signal of the fourth high efficiency amplifier and one of the output signals of the third high efficiency amplifier are the same, but with opposite phase. Additionally, the first and second high efficiency amplifiers and equal third and fourth high efficiency amplifiers are substantially equal. With this arrangement, the switching power source can be controlled by combining the output signal of the first and fourth high efficiency amplifiers and the output signal of the second and third high efficiency amplifiers.

In a power amplifier according to the invention; a selection circuit comprises: a first transistor to the base of which is applied the output signal of said first high efficiency amplifier; a second transistor to the base of which is applied the output signal of said second high efficiency amplifier; a third transistor to the base of which is applied the output signal of said third high efficiency amplifier; a fourth transistor to the base of which is applied the output signal of said fourth high efficiency amplifier; fifth and sixth transistors having commonly connected emitters and collectors and having bases connected to the corresponding first and second transistors; seventh and eighth transistors having commonly connected emitters and collectors and having bases connected to the corresponding third and fourth transistors; a current mirror circuit for inverting the collector currents of said fifth, sixth, seventh and eighth transistors; a ninth transistor having the base connected to the commonly connected emitters of said fifth and sixth transistors and to the commonly connected emitters of said seventh and eighth transistors; and a diode connected between said current mirror circuit and the emitter of said ninth transistor.

Advantageously, a power amplifier apparatus according to the invention is used for a 4-channel stereophonic system. In a 4-channel stereophonic system for a motor vehicle, preferably, said first high efficiency amplifier is a left front audio signal amplifier and said second high efficiency amplifier is a left rear audio signal amplifier, whereas said third high efficiency amplifier is a right front audio signal amplifier and said fourth high efficiency amplifier is a right rear audio signal amplifier.

As described above, with a power amplifier apparatus according to the invention, one of the output signals of the left front and right rear high efficiency amplifiers and non-corresponding one of the output signals of the left rear and right front high efficiency amplifiers are added. The highest level output signal is then selected to drive the switching power source for switching operation. With this arrangement, the number of output signals that are used as input signals of adders can be reduced to simplify the adder circuit configurations. More specifically, a power amplifier apparatus according to the invention only requires adders for two channels, instead of four, because an output signal is used from each of the 4-channel high efficiency amplifiers.

When the above listed components of a power amplifier apparatus according to the invention are integrally arranged on a single chip, the surface area occupied by adders can be significantly reduced.

DESCRIPTION OF THE PREFERRED EMBODIMENT

Figure 1:
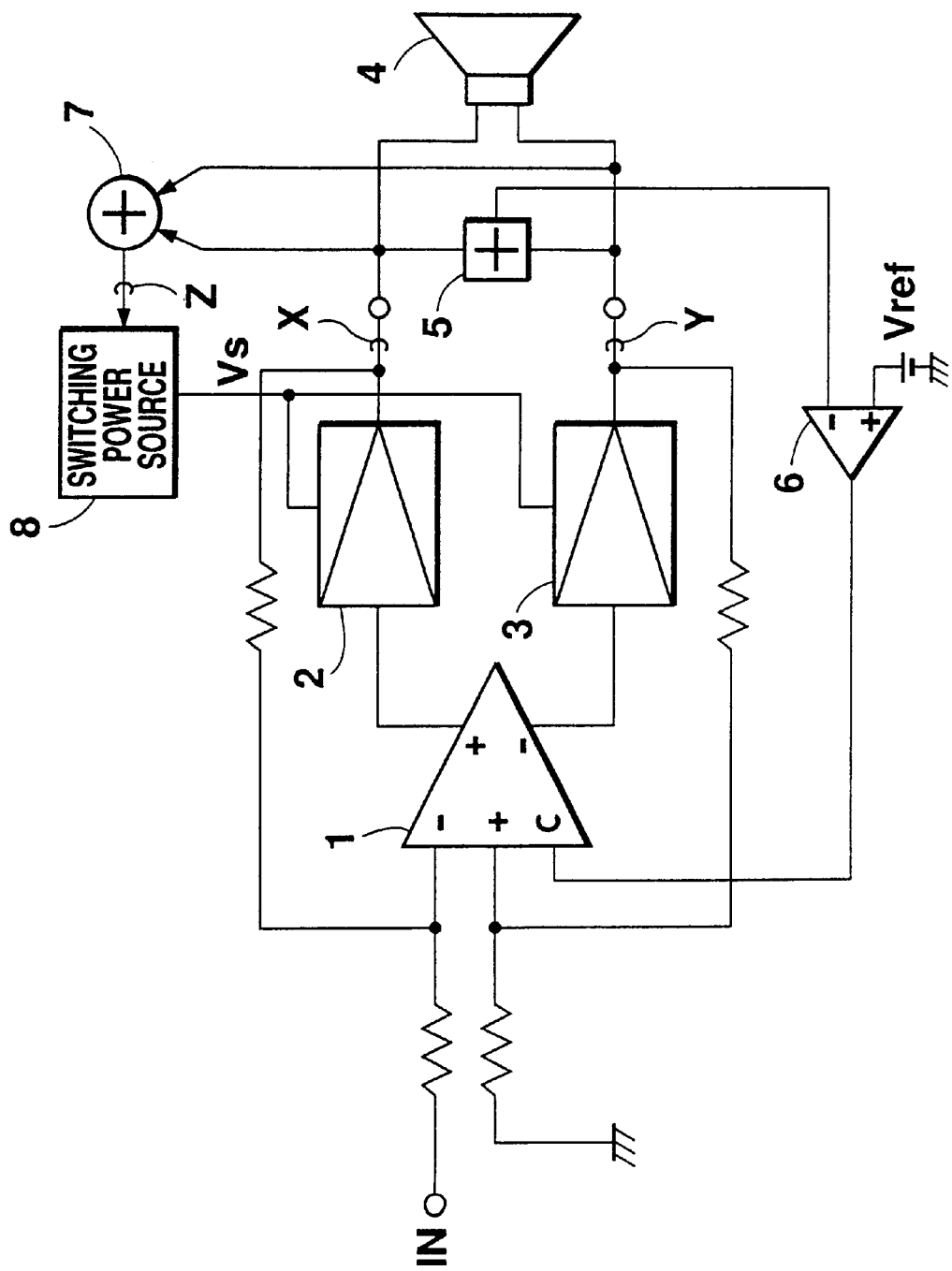
FIG. 1 is a schematic block diagram of a known power amplifier.
Figure 3:
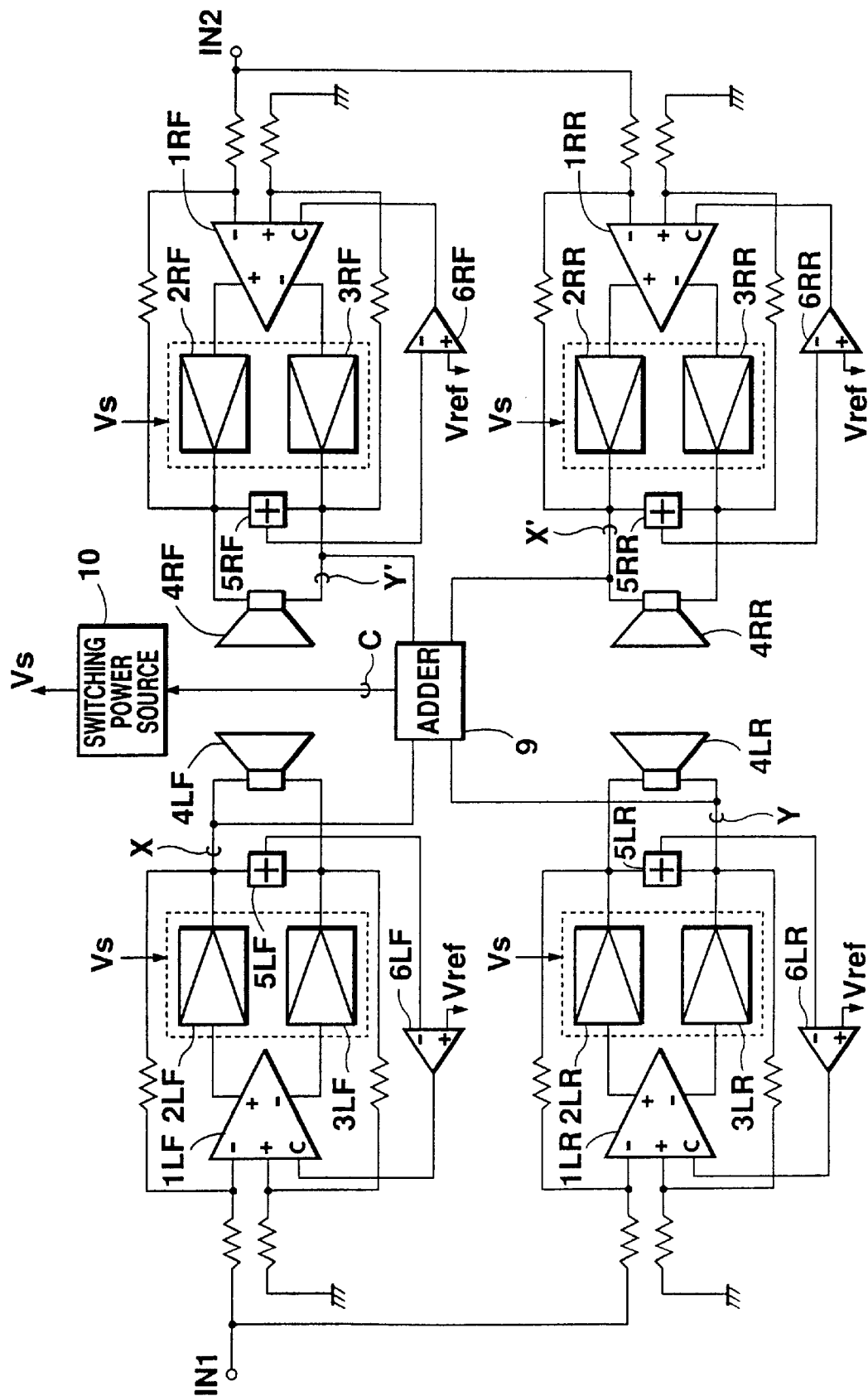
FIG. 3 is a schematic block diagram of a preferred embodiment of power amplifier apparatus according to the invention.

FIG. 3 is a schematic block diagram of a preferred embodiment of the invention. Referring to FIG. 3, adder 9 adds the respective output signals of left front output amplifier 2LF, left rear output amplifier 3LR, right front second output amplifier 3RF and right rear first output amplifier 2RR. Switching power source 10 is adapted for switching operation according to the output signal of the adder 9 and generating a power source voltage. Note that, in FIG. 3, the components corresponding to those of the known power amplifier of FIG. 1 are denoted respectively by the same reference symbols except that the reference symbols of the left front, left rear, right front and right rear amplifiers are suffixed by "LF", "LR", "RF" and "RR" respectively in FIG. 3. Also note that each of the power amplifiers operates in the same manner as the known power amplifier of FIG. 1.

Figure 2A:
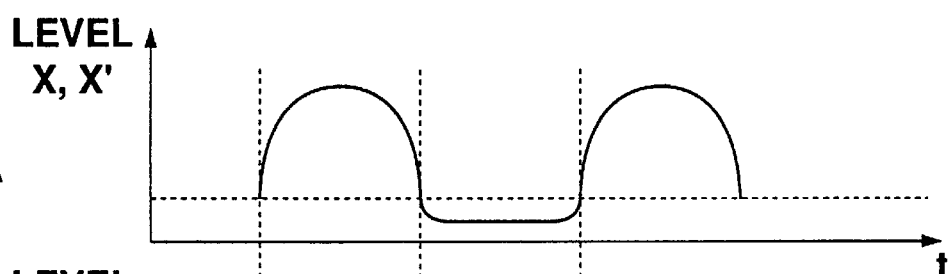
FIGS. 2A, 2B and 2C are graphs showing the waveforms of output signals that can be use for an embodiment of power amplifier according to the invention.
Figure 2B:
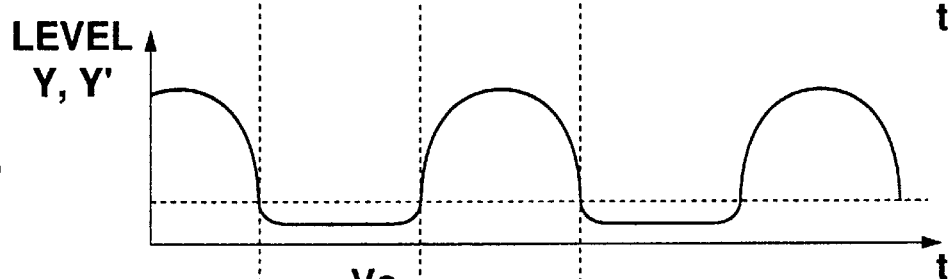
Figure 2C:
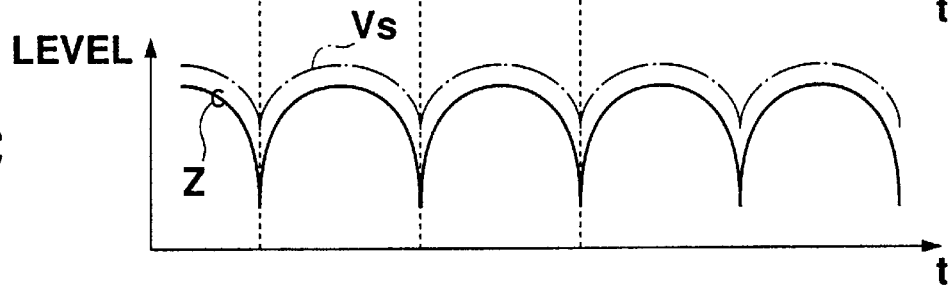

First, the operation of the adder 9 will be described in terms of left audio signals. Output signal X of the left front first output amplifier 2LF and output signal Y of the left rear second output amplifier 3LR are applied to the adder 9. The output signal X of the left front first output amplifier 2LF is generated corresponding to a positive left audio signal, whereas the output signal Y of the left rear second output amplifier 3LR is generated corresponding to a negative left audio signal. As the two output signals are added by the adder 9, the latter produces output signal z having a waveform obtained by combining the positive and negative left audio signals as shown in FIG. 2C. The output signal z of the adder 9 is applied to the switching power source 10, which is adapted to operate for switching according to the received output signal and generate power source voltage Vs. The power source voltage Vs has a waveform similar to that of the output signal of the adder 9 but its level is higher than that of the output signal of the left front first output amplifier 2LF or the output signal of the left rear second output amplifier 3LR by a predetermined value. Thus, the power source voltage Vs follows the output signals of the first output amplifiers 2LF and 2LR in a front half of each period of the left audio signals and those of the second output amplifiers 3LF and 3LR in the remaining half of each period of the left audio signals. In this manner, the power source voltage of the output amplifiers can be made to vary as a function of the positive and negative left audio signals produced by the respective left front and left rear power amplifiers.

Now, the operation of the adder 9 will be described in terms of right audio signals. While the operation is similar to that described above in terms of left audio signals, it should be noted that output signal Y' of the right front second output amplifier 3RF and output signal X' of the right rear first output amplifier 2RR are applied to the adder 9. Thus, the output signal of the adder 9 shows a waveform obtained by combining the positive and negative right audio signals. Therefore, the power source voltage Vs of the switching power source 10 follows the output signals of the first output amplifiers 2RF and 2RR in a front half of each period of the right audio signals and those of the second output amplifiers 3RF and 3RR in the remaining half of each period of the right audio signals. In this manner, the power source voltage of the output amplifiers can be made to vary as a function of the positive and negative right audio signals produced by the respective right front and right rear power amplifiers.

Now, the operation of the adder 9 will be described in terms of audio signals for the left and right front power amplifiers. Output signal X of the left front first output amplifier 2LF and output signal Y' of the right front second output amplifier 3RF are applied to the adder 9. The output signal of the left front first output amplifier 2LF is generated corresponding to a positive left audio signal, while that of the right front second output amplifier 3RF is generated corresponding to a negative right audio signal. As the two signals are added by the adder 9, the latter produces an output signal having a waveform obtained by combining the positive left audio signal and the negative right audio signal as shown in FIG. 2C. Since the left and right stereo audio signals scarcely show different waveforms, it may be safely assumed that the left and right audio signals have a same waveform. Thus, the output signal of the adder 9 will be same as the output signal of the adder 9 as described above in terms of left or right audio signals. Therefore, the power source voltage Vs of the switching power source 10 generated according to the output signal of the adder 9 follows the output signals of the first output amplifiers 2LF and 2RF in a front half of each period of the input audio signals and those of the second output amplifiers 3LF and 3RF in the remaining half of each period of the input audio signals. In this manner, the power source voltage of the output amplifiers can be made to vary as a function of the left and right audio signals produced by using the positive and negative output signals of the left front and right front power amplifiers respectively.

Now, the operation of the adder 9 will be described in terms of audio signals for the left and right rear power amplifiers. It will be appreciated that the adder 9 operates in a manner similar to that described above in terms of audio signals for the left and right front power amplifiers. Note that output signal Y of the left rear second output amplifier 3LR and output signal X' of the right rear first output amplifier 2RR are applied to the adder 9. Thus, the adder 9 produces an output signal having a waveform obtained by combining the negative left audio signal and the positive right audio signal. Therefore, the power source voltage Vs of the switching power source 10 generated according to the output signal of the adder 9 follows the output signals of the first output amplifiers 2LR and 2RR in a front half of each period of the input audio signals and those of the second output amplifiers 3LR and 3RR in the remaining half of each period of the input audio signals. In this manner, the power source voltage of the output amplifiers can be made to vary as a function of the left and right audio signals produced by using the positive and negative output signals of the respective left rear and right rear power amplifiers.

Thus, the adder 9 produces a signal obtained by adding the positive and negative output signals of the power amplifiers as described above in terms of left and right audio signals and audio signals for the left and right power amplifiers and for the front and rear power amplifiers. Additionally, the adder 9 selects the signal showing the highest level out of the input signals it receives and produces it as its own output signal. For example, if four signals are applied to the adder 9 simultaneously, the adder 9 selects the signal showing the highest level out of the four signals and applies it to the switching power source 10. Since the switching power source 10 carries out a switching operation according to the output signal of the adder 9, the output voltage Vs of the switching power source 10 corresponds to the output signal of the high efficiency amplifier that shows the highest level among the output signals of the four high efficiency power amplifiers. Therefore, the four high efficiency amplifiers can be satisfactorily driven by the output voltage Vs.

The switching power source 10 may be adapted to generate an output voltage corresponding to the output signal that shows the highest level among the output signals of the four high efficiency amplifiers if the output signals of the left front output amplifier 3LF, the left rear output amplifier 2LR, the right front output amplifier 2RF and the right rear output amplifier 3RR are combined in place of the above described combination of the output signals of the left front output amplifier 2LF, the left rear output amplifier 3LR, the right front output amplifier 3RF and the right rear output amplifier 2RR illustrated in FIG. 3.

Figure 4:
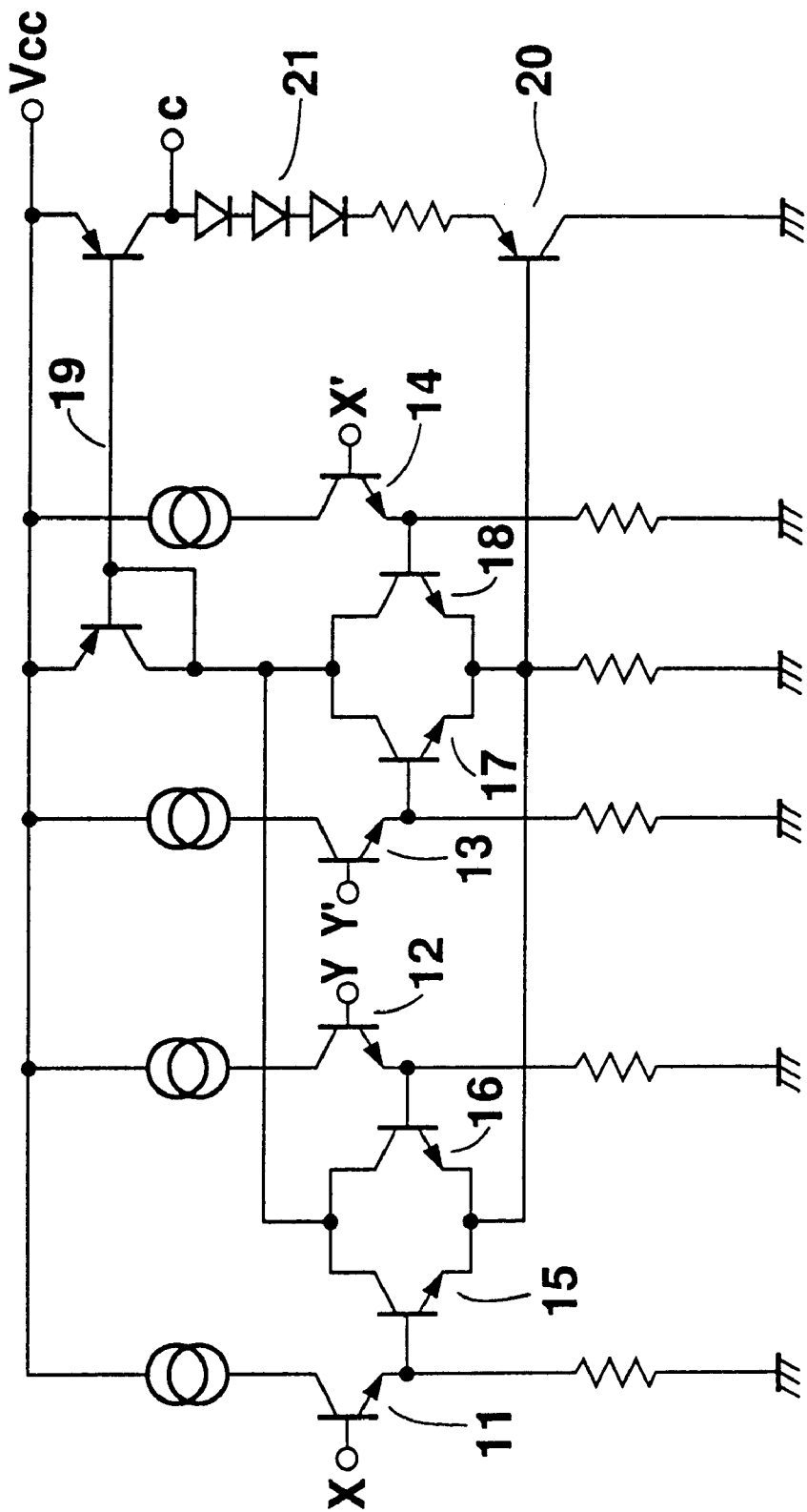
FIG. 4 is a circuit diagram of the adder 9 of FIG. 3.

FIG. 4 is a circuit diagram of an adder that can be used for the purpose of the invention. This adder comprises transistors 11, 12, 13 and 14 for receiving the output signals of the left front output amplifier 2LF, the left rear output amplifier 3LR, the right front output amplifier 3RF and the right rear output amplifier 2RR, transistors 15 and 16 having bases connected to the emitters of the transistors 11 and 12 respectively and the emitters and the collectors commonly connected with each other, transistors 17 and 18 having bases connected to the emitters of the transistors 13 and 14 respectively and the emitters and the collectors commonly connected with each other, a current mirror circuit 19 for inverting the collector currents of the transistors 15 through 18, a transistor 20 having the base connected to the emitters of the transistors 15 through 18 and a diode 21 connected between the current mirror circuit 19 and the emitter of the transistor 20.

If, using transistor 11 as an example of any one of the transistors 11 through 14, or the transistor 11, is energized by an input signal applied to its base, the collector current of the transistor is fed to the transistor 20 and the diode 21 by way of the current mirror circuit 19 to turn on the transistor 20 and the diode 21. The base voltage of the transistor 11 that corresponds to the input signal is reduced by the voltage between the base and the emitter of the transistors 11 and 15 so that the reduced voltage is applied to the emitter of the transistor 15. Meanwhile, since the transistor 20 and the diode 21 are on, the emitter voltage of the transistor 15 is raised by the voltage between the base and the emitter of the transistors and the forward voltage of the diode 21 multiplied by three. Thus, a voltage corresponding to the output signal of the left front output amplifier 2LF is produced at the output terminal C.

If, using transistor 11 and 12 for any two out of the four transistors, or the transistors 11 and 12, are energized by an input signal, the collector currents of the transistors 11 and 12 are fed to the transistor 20 and the diode 21 by way of the current mirror circuit 19. Meanwhile, the base voltages of the transistors 11 and 12 are reduced by the voltage between the base and the emitter of the transistors 11 and 15 or the voltage between the base and the emitter of the transistors 12 and 16 respectively. Thereafter, emitter voltages of the transistors 15 and 16 are raised by the voltage between the base and the emitter of the transistors and the forward voltage of the diode 21. If the transistors 11 and 12 shows respective emitter voltages that are different from each other, the output terminal C produces a voltage that corresponds to the output signal of the left front output amplifier 2LF or that of the left rear output amplifier 3LR, whichever is higher.

Finally, if three or all of the transistors 11 through 14 are energized, the output terminal C produces a voltage that corresponds to the output signal showing the highest level out of the output signals of the three or four energized transistors.

Thus, the output signal showing the highest level is selected out of the output signals of the high efficiency power amplifiers and the output terminal C produces an output signal that corresponds to the selected highest level output signal.

What is claimed is:

1. A power amplifier apparatus comprising:
   first and second high efficiency amplifiers for amplifying a first input signal and BTL-driving first and second loads by means of their respective output signals;
   third and fourth high efficiency amplifiers for amplifying a second input signal and BTL-driving third and fourth loads by means of their respective output signals;
   said first and third high efficiency amplifiers forming a pair, while said second and fourth high efficiency amplifiers forming another pair;
   a selection circuit for selecting the signal with the highest level from among the output signals of said first and fourth high efficiency amplifiers showing respective phases substantially equal to each other and predetermined respective levels and the output signals of said second and third high efficiency amplifiers showing respective phases substantially equal to each other and predetermined respective levels; and
   a switching power source adapted for switching operation as a function of the output signal of said selection circuit and generating a power source voltage for said first through fourth high efficiency amplifiers.

2. A power amplifier apparatus according to claim 1, wherein each of said first through fourth high efficiency amplifiers comprises:
   first and second output amplifiers for generating respective first and second output signals to BTL-drive the corresponding loads;
   a non-linear adder for non-linearly adding the output signals of said first and second output amplifiers; and
   a non-linear amplifier for amplifying the input signal and generating an output signal to be applied to said first and second output amplifiers as its output DC voltage is controlled by the output signal of said non-linear adder.

3. A power amplifier apparatus according to claim 1, wherein said selection circuit comprises:
   a first transistor to the base of which is applied the output signal of said first high efficiency amplifier;
   a second transistor to the base of which is applied the output signal of said second high efficiency amplifier;
   a third transistor to the base of which is applied the output signal of said third high efficiency amplifier;
   a fourth transistor to the base of which is applied the output signal of said fourth high efficiency amplifier;
   fifth and sixth transistors having commonly connected emitters and collectors and having bases connected to the corresponding first and second transistors;
   seventh and eighth transistors having commonly connected emitters and collectors and having bases connected to the corresponding third and fourth transistors;
   a current mirror circuit for inverting the collector currents of said fifth, sixth, seventh and eighth transistors;
   a ninth transistor having a base connected to the commonly connected emitters of said fifth and sixth transistors and to the commonly connected emitters of said seventh and eighth transistors; and
   a diode connected between said current mirror circuit and the emitter of said ninth transistor.

4. A power amplifier apparatus according to claim 1 adapted for use with a 4-channel stereophonic system.

5. A power amplifier apparatus according to claim 1 and adapted for use with a 4-channel stereophonic system in a motor vehicle, wherein said first high efficiency amplifier is a left front audio signal amplifier;
   said second high efficiency amplifier is a left rear audio signal amplifier;
   said third high efficiency amplifier is a right front audio signal amplifier; and said fourth high efficiency amplifier is a right rear audio signal amplifier.

6. A power amplifier apparatus comprising:
   first and second high efficiency amplifiers for amplifying a first input signal and BTL-driving first and second loads by means of their respective output signals;
   third and fourth high efficiency amplifiers for amplifying a second input signal and BTL-driving third and fourth loads by means of their respective output signals;
   said first and third high efficiency amplifiers forming a pair, while said second and fourth high efficiency amplifiers forming another pair;
   one of the two output signals of said first high efficiency amplifier and the non-corresponding one of the two output signals of said second high efficiency amplifier are the same, but with opposite phases;
   one of the two output signals of said third high efficiency amplifier and the non-corresponding one of the two output signals of said fourth high efficiency amplifier are the same, but with opposite phases;
   said one of the output signals of said first high efficiency amplifier and said non-corresponding one of the output signals of said fourth high efficiency amplifier are substantially in-phase; and
   said non-corresponding one of the output signals of said second high efficiency amplifier and said one of the output signals of said third high efficiency amplifier being substantially in-phase; further comprising
   a selection circuit for selecting the signal with the highest level from among the output signals of said first and fourth high efficiency amplifiers showing respective phases substantially equal to each other and predetermined respective levels and the output signals of said second and third high efficiency amplifiers showing respective phases substantially equal to each other and predetermined respective levels; and
   a switching power source adapted for switching operation as a function of the output signal of said selection circuit and generating a power source voltage for said first through fourth high efficiency amplifiers.

7. A power amplifier apparatus according to claim 6, wherein each of said first through fourth high efficiency amplifiers comprises:

first and second output amplifiers for generating respective first and second output signals to BTL-drive the corresponding loads;

a non-linear adder for non-linearly adding the output signals of said first and second output amplifiers; and a non-linear amplifier for amplifying the input signal and generating an output signal to be applied to said first and second output amplifiers as its output DC voltage is controlled by the output signal of said non-linear adder.

8. A power amplifier apparatus according to claim 6, wherein said selection circuit comprises:

a first transistor to the base of which is applied the output signal of said first high efficiency amplifier;

a second transistor to the base of which is applied the output signal of said second high efficiency amplifier;

a third transistor to the base of which is applied the output signal of said third high efficiency amplifier;

a fourth transistor to the base of which is applied the output signal of said fourth high efficiency amplifier;

fifth and sixth transistors having commonly connected emitters and collectors and having bases connected to the corresponding first and second transistors;

seventh and eighth transistors having commonly connected emitters and collectors and having bases connected to the corresponding third and fourth transistors;

a current mirror circuit for inverting the collector currents of said fifth, sixth, seventh and eighth transistors;

a ninth transistor having a base connected to the commonly connected emitters of said fifth and sixth transistors and to the commonly connected emitters of said seventh and eighth transistors; and a diode connected between said current mirror circuit and the emitter of said ninth transistor.

9. A power amplifier apparatus according to claim 6 adapted for use with a 4-channel stereophonic system.

10. A power amplifier apparatus according to claim 6 and adapted for use with a 4-channel stereophonic system in a motor vehicle, wherein said first high efficiency amplifier is a left front audio signal amplifier;

said second high efficiency amplifier is a left rear audio signal amplifier; said third high efficiency amplifier is a right front audio signal amplifier; and said fourth high efficiency amplifier is a right rear audio signal amplifier.

\* \* \* \* \*